US011749545B2

(12) United States Patent
Hayashi et al.

(10) Patent No.: US 11,749,545 B2
(45) Date of Patent: Sep. 5, 2023

(54) SUBSTRATE-FLOATATION-TYPE LASER PROCESSING APPARATUS AND METHOD FOR MEASURING FLOATING HEIGHT

(71) Applicant: JSW AKTINA SYSTEM CO., LTD., Yokohama (JP)

(72) Inventors: Daisuke Hayashi, Tokyo (JP); Takahiro Mikami, Tokyo (JP); Yuki Suzuki, Tokyo (JP)

(73) Assignee: JSW AKTINA SYSTEM CO., LTD, Yokohama (JP)

( * ) Notice: Subject to any disclaimer, the term of this patent is extended or adjusted under 35 U.S.C. 154(b) by 385 days.

(21) Appl. No.: 16/888,612

(22) Filed: May 29, 2020

(65) Prior Publication Data
US 2021/0020481 A1  Jan. 21, 2021

(30) Foreign Application Priority Data
Jul. 16, 2019  (JP) .................................. 2019-130992

(51) Int. Cl.
*H01L 21/67* (2006.01)
*B65G 19/02* (2006.01)
*H01L 21/02* (2006.01)

(52) U.S. Cl.
CPC ........ *H01L 21/67259* (2013.01); *B65G 19/02* (2013.01); *H01L 21/67115* (2013.01); *H01L 21/02675* (2013.01)

(58) Field of Classification Search
CPC ......... H01L 21/67259; H01L 21/02675; H01L 21/67784; B65G 19/02
See application file for complete search history.

(56) References Cited

FOREIGN PATENT DOCUMENTS

| CN | 1949079 B | * | 11/2010 | |
| CN | 112242335 A | * | 1/2021 | ............. B65G 19/02 |
| JP | 2006-170640 A | | 6/2006 | |
| JP | 2007088201 A | * | 4/2007 | |
| JP | 2009-220142 A | | 10/2009 | |
| JP | 2011-237243 A | | 11/2011 | |
| JP | 2014014840 A | * | 1/2014 | |

(Continued)

OTHER PUBLICATIONS

Office Action dated Mar. 14, 2023, in Japanese Patent Application No. 2019-130992.

*Primary Examiner* — Jarrett J Stark
(74) *Attorney, Agent, or Firm* — Potomac Law Group, PLLC

(57) ABSTRACT

A substrate-floatation-type laser processing apparatus and a method for measuring a floating height, capable of improving performance of laser processing are provided. A substrate-floatation-type laser processing apparatus according to an embodiment includes a stage configured to float and convey a substrate, and a floating-height measurement apparatus configured to measure a floating height H of the substrate. Note that a distance between the floating-height measurement apparatus and the substrate can be automatically adjusted according to the measured floating height H. The floating height H of the substrate is measured by applying laser light to the substrate and the stage. The distance between the floating-height measurement apparatus and the substrate is adjusted by using a feedback mechanism in which the measured floating height of the substrate is used as an input.

12 Claims, 13 Drawing Sheets

(56) References Cited

FOREIGN PATENT DOCUMENTS

| JP | 2016-035960 | A | | 3/2016 |
|---|---|---|---|---|
| JP | 2017-089894 | A | | 5/2017 |
| JP | 2018-064048 | A | | 4/2018 |
| KR | 20100031066 | A | * | 3/2010 |

* cited by examiner

SUBSTRATE-FLOATATION-TYPE LASER PROCESSING APPARATUS AND METHOD FOR MEASURING FLOATING HEIGHT

INCORPORATION BY REFERENCE

This application is based upon and claims the benefit of priority from Japanese patent application No. 2019-130992, filed on Jul. 16, 2019, the disclosure of which is incorporated herein in its entirety by reference.

BACKGROUND

The present disclosure relates to a substrate-floatation-type laser processing apparatus and a method for measuring a floating height.

Japanese Unexamined Patent Application Publication No. 2018-064048 discloses a laser processing apparatus for irradiating a substrate including an amorphous film formed over a glass substrate or the like with laser light and thereby performing an annealing process therefor. In the laser processing apparatus disclosed in Japanese Unexamined Patent Application Publication No. 2018-064048, the annealing process is performed over a floatation stage over which a substrate is floated by ejected air.

SUMMARY

Regarding the floatation stage for floating a substrate, it is necessary to accurately control the floatation of the substrate in order to apply laser light to a desired place. Therefore, it is necessary to precisely measure the floating height of the substrate. However, the floating height has not been measured with satisfactory precision and hence there is room for improvement in the measurement.

Other problems to be solved and novel features will become apparent from descriptions in this specification and accompanying drawings.

A first exemplary aspect is a substrate-floatation-type laser processing apparatus including: a stage configured to float and convey a substrate; and a floating-height measurement apparatus configured to measure a floating height of the substrate. Note that a distance between the floating-height measurement apparatus and the substrate can be automatically adjusted according to the measured floating height.

According to the embodiment, it is possible to provide a substrate-floatation-type laser processing apparatus and a method for measuring a floating height, capable of improving performance of laser processing by suppressing the generation of dust and the like which would otherwise be caused by contact between the substrate and the stage and precisely controlling the irradiation place of laser light.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

For clarifying the description, the following description and the drawings have been partially omitted and simplified as appropriate. Further, the same symbols are assigned to the same or corresponding components throughout the drawings and redundant descriptions are omitted as appropriate.

First Embodiment

A substrate-floatation-type laser processing apparatus according to a first embodiment will be described. The substrate-floatation-type laser processing apparatus according to this embodiment is, for example, an excimer laser annealing (Excimer Laser Anneal) apparatus for forming a polysilicon film. Note that the substrate-floatation-type laser processing apparatus is not limited to the excimer laser annealing apparatus, provided that the apparatus performs laser processing while floating a substrate 50. The substrate-floatation-type laser processing apparatus according to this embodiment includes a floating-height measurement apparatus that measures a floating height of a substrate. A floating height of a substrate is measured by using the floating-height measurement apparatus, for example, after the substrate-floatation-type laser processing apparatus is assembled (i.e., manufactured) or when conditions are set before laser processing is performed.

Firstly, each component/structure of the substrate-floatation-type laser processing apparatus will be described hereinafter. Among the components/structures, a floating-height measurement apparatus according to this embodiment will be described while comparing it with a floating-height measurement apparatus according to a comparative example and explaining a problem that occurs in the floating-height measurement apparatus according to the comparative example. In this way, the substrate-floatation-type laser processing apparatus according to this embodiment is clarified even further.

Figure 1:
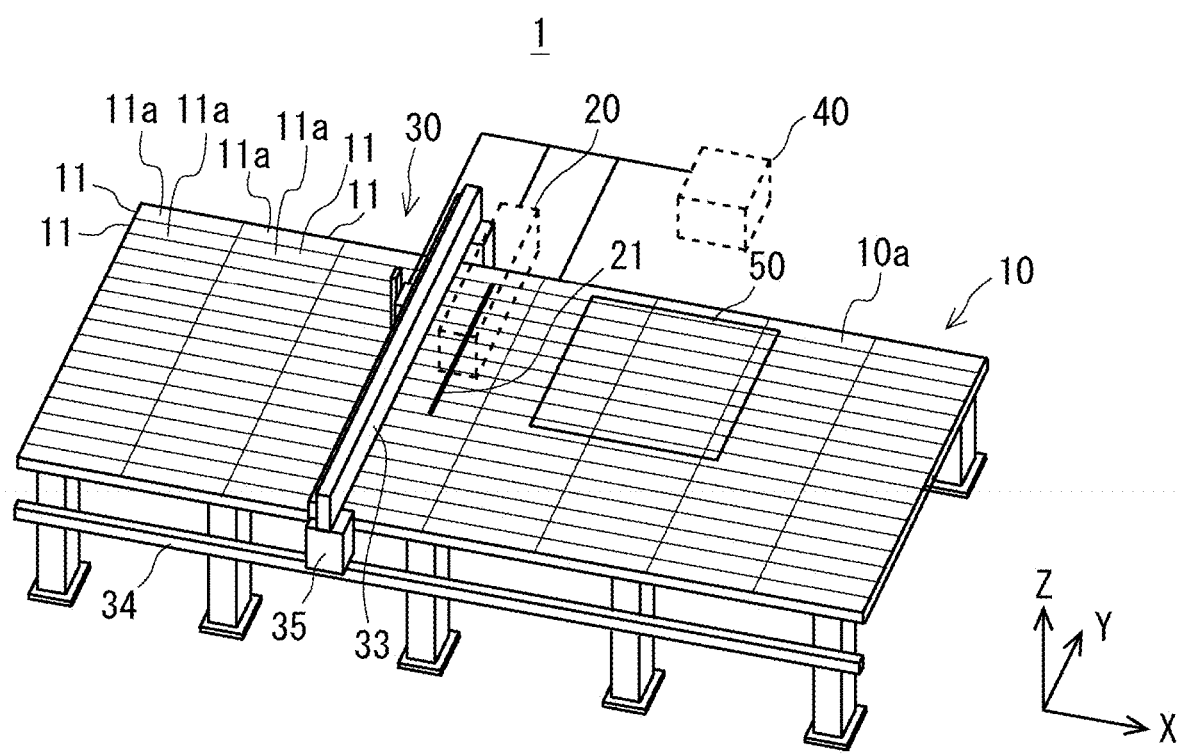
FIG. 1 is a perspective view schematically showing an example of a configuration of a substrate-floatation-type laser processing apparatus according to a first embodiment.
Figure 2:
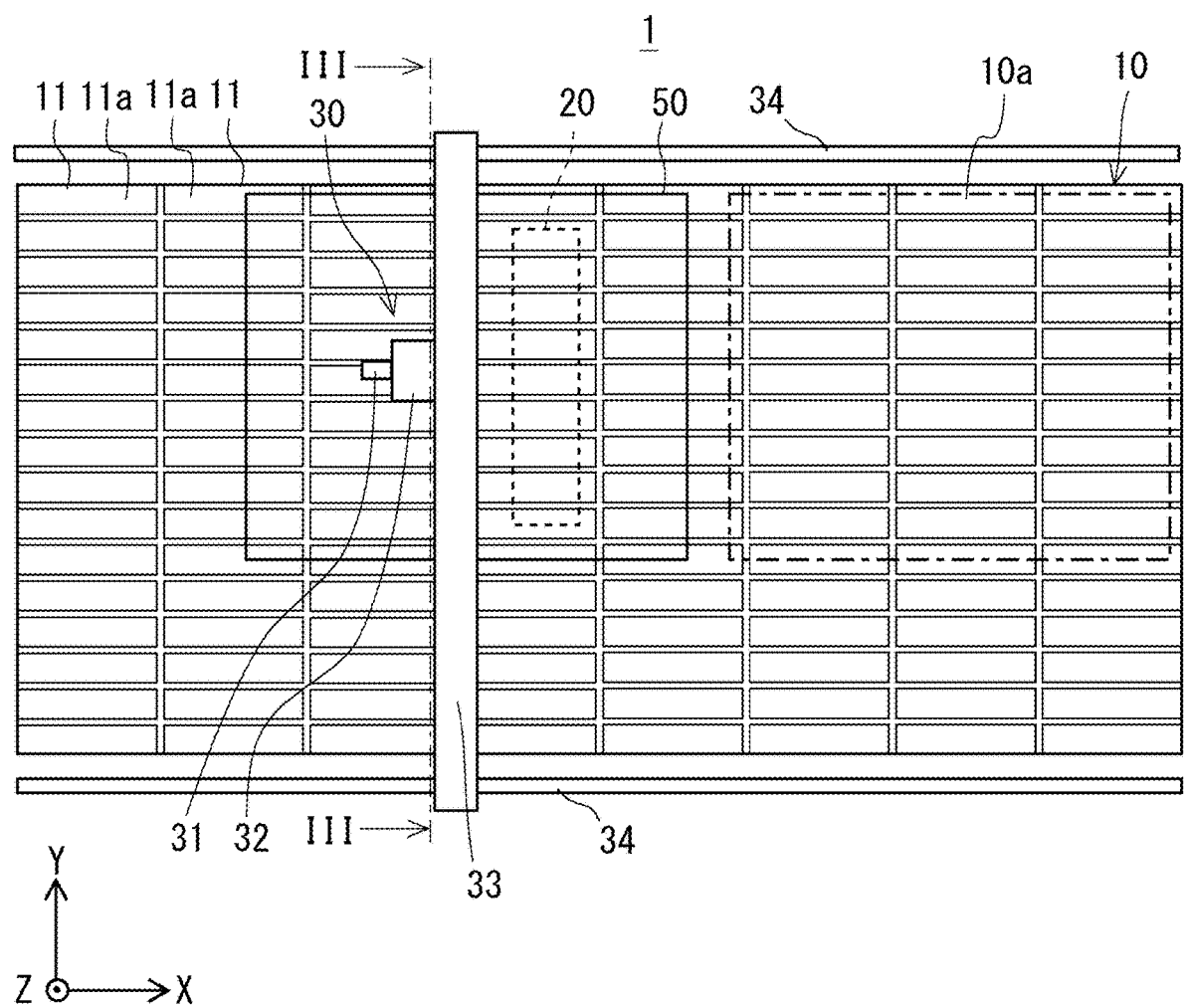
FIG. 2 is a plan view schematically showing an example of a stage of the substrate-floatation-type laser processing apparatus according to the first embodiment.
Figure 3:
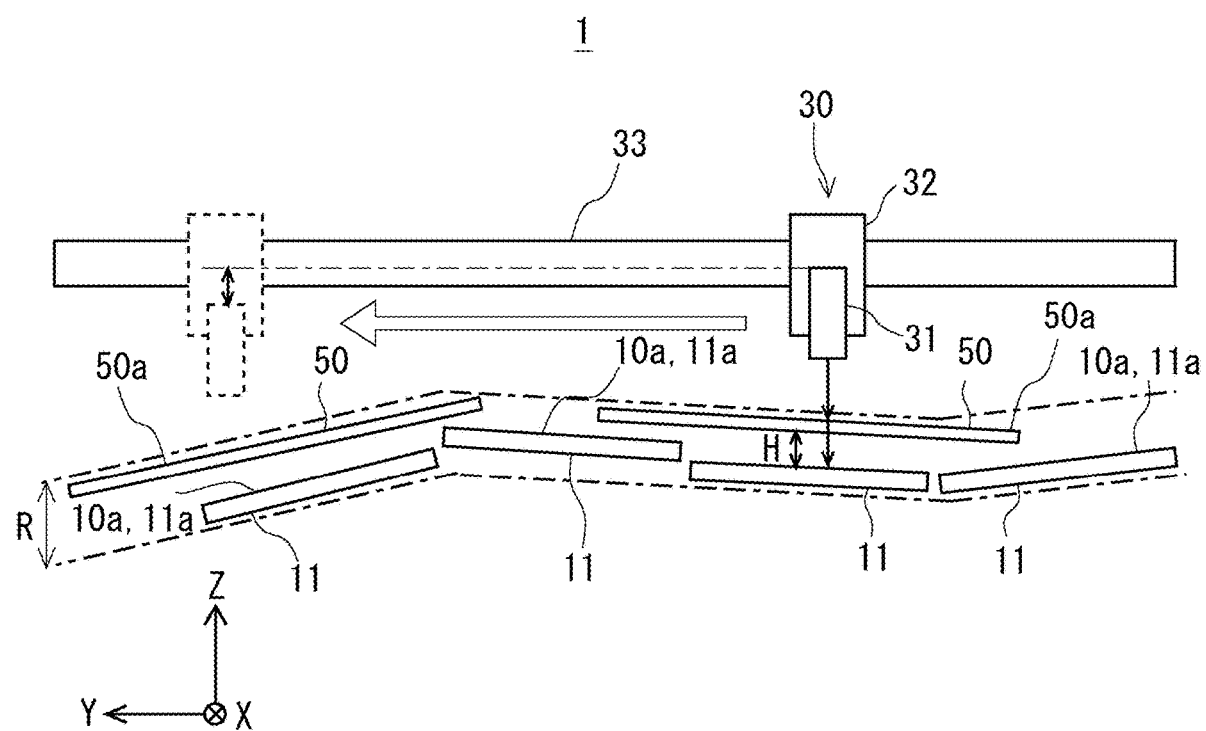
FIG. 3 shows the substrate-floatation-type laser processing apparatus according to the first embodiment as viewed from a line III-III indicated in FIG. 2.

FIG. 1 is a perspective view schematically showing an example of a configuration of a substrate-floatation-type laser processing apparatus according to the first embodiment. FIG. 2 is a plan view schematically showing an example of a stage of the substrate-floatation-type laser processing apparatus according to the first embodiment. FIG. 3 shows the substrate-floatation-type laser processing apparatus according to the first embodiment as viewed from a line III-III indicated in FIG. 2.

As shown in FIGS. 1 to 3, the substrate-floatation-type laser processing apparatus 1 includes a stage 10, a laser emission unit 20, a floating-height measurement apparatus 30, and a controller 40. Roughly speaking, in the substrate-floatation-type laser processing apparatus 1, while a substrate 50 is floated and conveyed over the stage 10, the laser emission unit 20 performs laser processing for the substrate 50.

Note that for the sake of explanation, an XYZ-orthogonal coordinate system is used as appropriate in the drawings described below. The Z-axis direction is a vertical upward/downward direction and the Y-axis direction is a direction along a linear laser spot irradiated by the laser emission unit 20. Further, the X-axis direction is a direction along which the substrate 50 is conveyed. While the substrate 50 is conveyed in the X-axis direction, linear laser light extending along the Y-axis direction is applied to the substrate 50. Further, the X- and Y-axis directions are directions along the sides of the substrate 50 having a rectangular shape.

Each component/structure of the substrate-floatation-type laser processing apparatus 1 will be described hereinafter.

<Stage>

The stage 10 floats and conveys the substrate 50. The stage 10 has a top surface facing upward. The top surface of the stage 10 is called a stage surface 10a. The stage surface 10a has, for example, a rectangular shape whose sides extend along the X- and Y-axis directions as viewed from above. The stage 10 includes a plurality of floatation units 11. Note that in FIGS. 1 to 3, reference numerals are added to only some of the floatation units 11 in order to simplify the drawings. Further, some components/structures may be omitted.

Each of the floatation units 11 has a top surface facing upward. The top surface of the floatation unit 11 is called a unit surface 11a. Each unit surface 11a has, for example, a rectangular shape whose sides extend along the X- and Y-axis directions as viewed from above. The stage surface 10a includes a plurality of unit surfaces 11a. For example, the plurality of unit surfaces 11a are arranged in a matrix pattern in the X- and Y-axis directions in the stage surface 10a. Therefore, the stage surface 10a is composed of the plurality of unit surfaces 11a arranged in a matrix pattern.

The floatation unit 11 ejects air upward in order to float the substrate 50. For example, a plurality of air ejecting holes (not shown) are formed in the unit surfaces 11a of the floatation units 11, and the substrate 50 is floated by air ejected from the air ejecting holes. Note that in the floatation units 11, air may be ejected from a porous material provided in the upper part thereof, instead of using the air ejecting holes.

Ejection air pipes (not shown) are connected below the floatation units 11. The ejection air pipes are connected, for example, to a pump(s) through a valve(s) and an air flowmeter(s). The valve(s) and the air flowmeter(s) are connected to the controller 40 through signal lines or the like. The floating height of the substrate 50 over the stage surface 10a is controlled by controlling the valve(s) and the pump(s) by using the controller 40.

The stage 10 may be equipped with a grasping mechanism (not shown) for conveying the substrate 50. Over the stage 10, the substrate 50 may be conveyed by grasping an end of the substrate 50 with the grasping mechanism, or may be conveyed by grasping a central part of the substrate 50 with the grasping mechanism.

<Substrate>

The substrate 50 is, for example, a glass substrate. The substrate 50 may be a semiconductor substrate such as a silicon substrate. The substrate 50 may include a semiconductor film. The semiconductor film is, for example, made of amorphous silicon. A purpose of the laser processing may be to convert the semiconductor film in the substrate 50 into a polycrystalline state, convert it into a monocrystalline state, reform the semiconductor film, inactivate impurities, or stabilize impurities. For example, at least a part of the amorphous semiconductor film is transformed into a polycrystalline state by irradiating it with laser light. Note that the laser processing is not limited to those having such purposes. The laser processing may include any kind of processing in which heat treatment is performed for a substrate 50 by irradiating it with laser light. Further, the substrate 50 is not limited to the glass substrate and the semiconductor substrate, provided that laser processing is performed for the substrate.

<Laser Emission Unit>

The laser emission unit 20 emits laser light. For example, the laser emission unit 20 applies excimer laser light to the substrate 50. Note that the laser light emitted from the laser emission unit 20 is not limited to the excimer laser light. That is, the laser emission unit 20 may emit any kind of laser light suitable for the intended laser processing. The irradiation spot 21 of the laser light that the laser emission unit 20 applies to the substrate 50 has, for example, a linear shape extending in the Y-axis direction.

<Floating-Height Measurement Apparatus: Floating Height>

Figure 4:
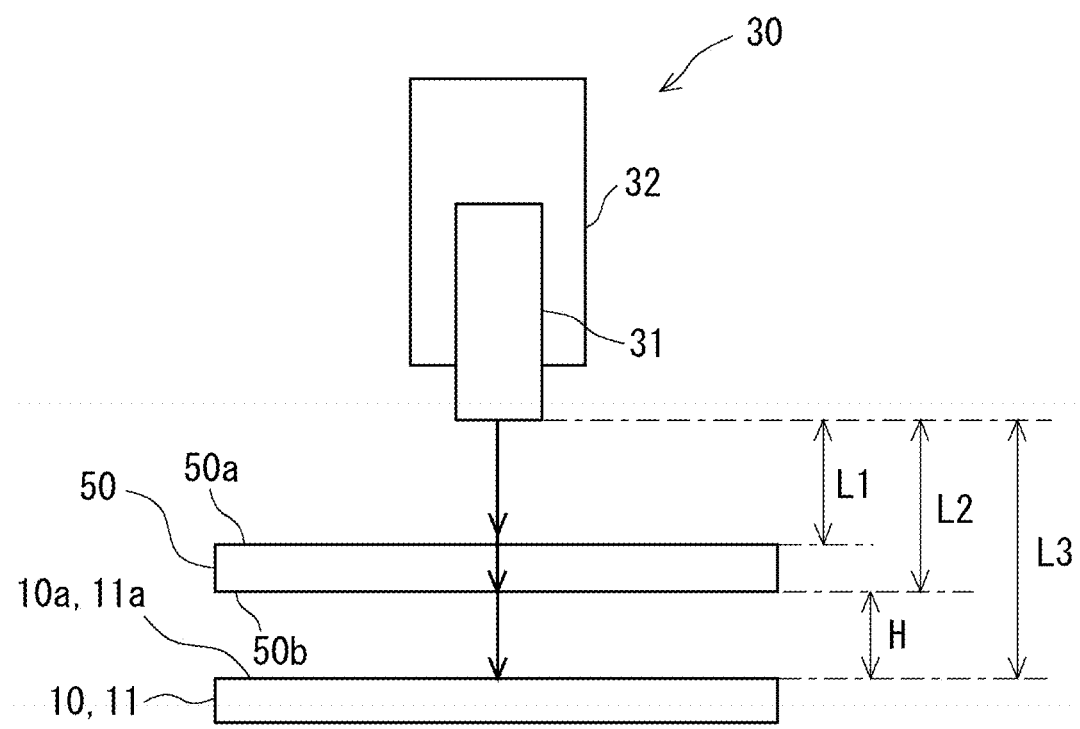
FIG. 4 shows an example of a floating height measured by a floating-height measurement apparatus in the substrate-floatation-type laser processing apparatus according to the first embodiment.

FIG. 4 shows an example of a floating height measured by a floating-height measurement apparatus in the substrate-floatation-type laser processing apparatus according to the first embodiment. As shown in FIG. 4, the floating-height measurement apparatus 30 measures a floating height H of a substrate 50. The floating height H of the substrate 50 means a distance from the stage surface 10a to the bottom surface 50b of the substrate 50. The distance from the floating-height measurement apparatus 30 to the top surface 50a of the substrate 50 is referred to as a distance L1 and the distance from the floating-height measurement apparatus 30 to the bottom surface 50b of the substrate 50 is referred to as a distance L2. Further the distance from the floating-height measurement apparatus 30 to the stage surface 10a, i.e., to the unit surface 11a is referred to as a distance L3. Then, the floating height H of the substrate 50 is expressed as "Floating height H=Distance L3−Distance L2".

<Floating-Height Measurement Apparatus: Laser Displacement Gauge>

The floating-height measurement apparatus 30 includes, for example, a laser displacement gauge 31 and a height adjustment stage 32. The laser displacement gauge 31 applies laser light to the substrate 50 and the stage 10, and receives reflected light of the laser light reflected by the substrate 50 and the stage 10. The laser displacement gauge 31 simultaneously measures (e.g., calculates) the distance L1, the distance L2, and the distance L3 based on differences among the reflectance of reflected light of the laser light reflected by the top surface 50a of the substrate 50, the reflectance of reflected light reflected by the bottom surface 50b of the substrate 50, and the reflectance of reflected light reflected by the stage surface 10a. In this way, the laser displacement gauge 31 can measure the floating height H. As described above, the floating height H of the substrate 50 is measured by applying laser light to the substrate 50.

The height adjustment stage 32 is attached to the laser displacement gauge 31. The height adjustment stage 32 can adjust the position of the laser displacement gauge 31 in the Z-axis direction, i.e., the height of the laser displacement gauge 31. A measurement range R in which the distances L1, L2 and L3 can be measured is set in the laser displacement gauge 31. When the distances L1, L2 and L3 exceed the measurement range, the floating height H of the substrate 50 cannot be precisely measured. Therefore, the height adjustment stage 32 adjusts the height of the laser displacement gauge 31 so that the distances L1, L2 and L3 fall within the measurement range. Note that the floating-height measurement apparatus 30 is not limited to those equipped with the laser displacement gauge 31 as described later.

The floating-height measurement apparatus 30 may include a translation movement stage 33. The translation movement stage 33 is a rod-like movable stage extending in the Y-axis direction on a horizontal plane above the stage 10. The laser displacement gauge 31 is attached to the translation movement stage 33 with the height adjustment stage 32 interposed therebetween. Therefore, the laser displacement gauge 31 and the height adjustment stage 32 are slidably-movable in the Y-axis direction along the translation movement stage 33. In this way, the floating-height measurement apparatus 30 measures the floating height H of the substrate 50 along the Y-axis direction.

The floating-height measurement apparatus 30 may include a translation movement stage 34. In particular, two translation movement stages 34 are arranged so as to sandwich the stage 10 therebetween in the Y-axis direction. One of the translation movement stages 34 is disposed so as to extend in the X-axis direction along the side on the Y-axis direction positive side of the stage 10, and the other translation movement stage 34 is disposed so as to extend in the X-axis direction along the side on the Y-axis direction negative side. A frame 35 extending upward is attached to each of the translation movement stages 34 in such a manner that the frame 35 is slidable in the X-axis direction. The frame 35 of one of the translation movement stages 34 supports one end of the translation movement stage 33, and the frame 35 of the other translation movement stage 34 supports the other end of the translation movement stage 33. Therefore, the translation movement stage 33 is movable in the X-axis direction. In this way, the floating-height measurement apparatus 30 measures the floating height H of the substrate 50 along the X- and Y-axis directions.

Comparative Example: Floating-height Measurement Apparatus

Figure 5:
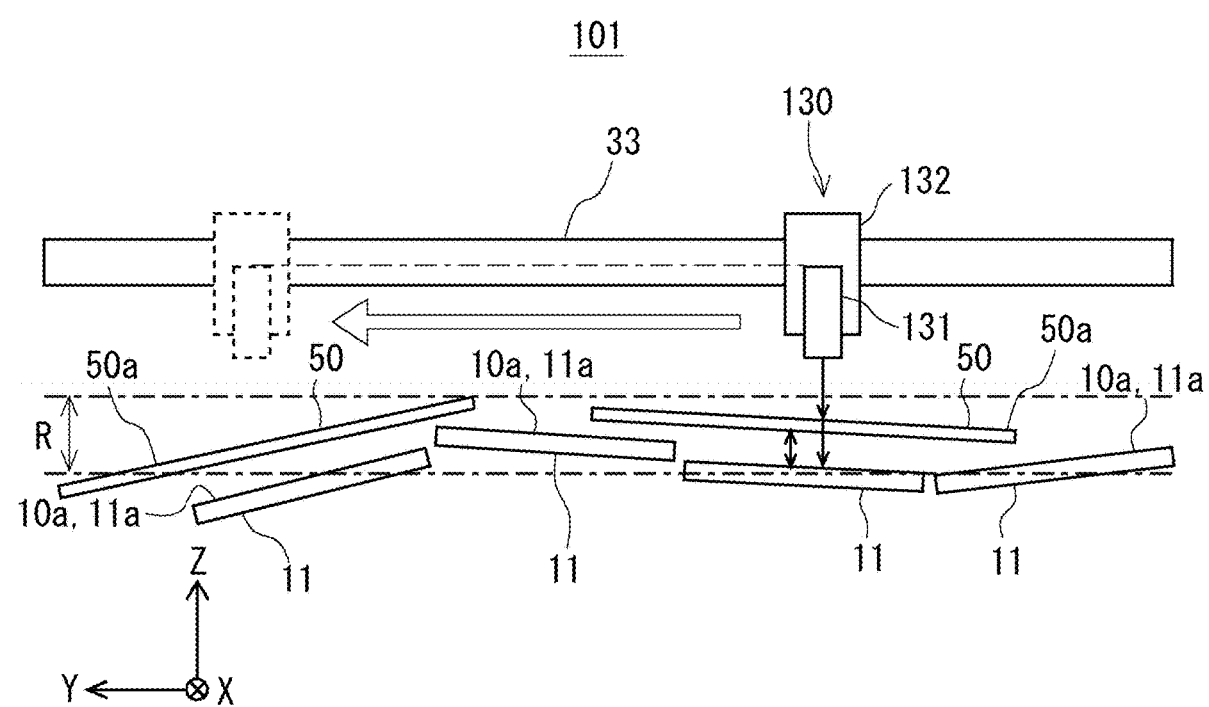
FIG. 5 shows an example of a floating-height measurement apparatus of a substrate-floatation-type laser processing apparatus according to a comparative example.

Next, a floating-height measurement apparatus of a substrate-floatation-type laser processing apparatus according to a comparative example will be described. FIG. 5 shows an example of a floating-height measurement apparatus of a substrate-floatation-type laser processing apparatus according to the comparative example. As shown in FIG. 5, the floating-height measurement apparatus 130 according to the comparative example also includes a laser displacement gauge 131, a height adjustment stage 132, and a translation movement stage 33. The stage 10 and the laser emission unit 20 of the substrate-floatation-type laser processing apparatus 101 according to the comparative example are similar to the stage 10 and the laser emission unit 20 of the substrate-floatation-type laser processing apparatus 1 according to the first embodiment.

Similarly to the laser displacement gauge 31, the laser displacement gauge 131 also applies laser light to the substrate 50 and the stage 10, and receives reflected light of the laser light reflected by the substrate 50 and the stage 10. The laser displacement gauge 131 simultaneously measures (e.g., calculates) the distance L1, the distance L2, and the distance L3 based on differences among the reflectance of reflected light of the laser light reflected by the top surface 50a of the substrate 50, the reflectance of reflected light reflected by the bottom surface 50b of the substrate 50, and the reflectance of reflected light reflected by the stage surface 10a. In this way, the laser displacement gauge 131 can measure the floating height H. When the floating-height measurement apparatus 130 measures the floating height of the substrate 50 by using the laser displacement gauge 131, it measures the floating height while moving the measurement place by using the translation movement stage 33. A measurement range in which the distances L1, L2 and L3 can be measured is set in the laser displacement gauge 131. When the distances L1, L2 and L3 exceed the measurement range, the laser displacement gauge 131 cannot precisely measure the floating height of the substrate.

As shown in FIG. 5, the stage surface 10a is composed of a plurality of unit surfaces 11a. The positions of the plurality of unit surfaces 11a may be displaced from one another in the Z-axis direction. Therefore, in the case where the floatation units 11 and the stage 10 do not have a planar relation therebetween over the entire stage surface 10a, the distances L1, L2 and L3 may exceed the measurement range R when the laser displacement gauge 131 is moved. Therefore, the floating height of the substrate 50 cannot be precisely measured.

As described above, the problem of the substrate-floatation-type laser processing apparatus 101 according to the comparative example is that when the floating height of the substrate 50 is measured by using the laser displacement gauge 131, the distances L1, L2 and L3 may exceed the measurement range R as the laser displacement gauge 131 is moved because the stage surface 10a is not planar over its entire area. In this case, it is necessary to adjust the height of the laser displacement gauge 131 by manually moving the height adjustment stage 132 so that the distances L1, L2 and L3 fall within the measurement range R.

Figure 6:
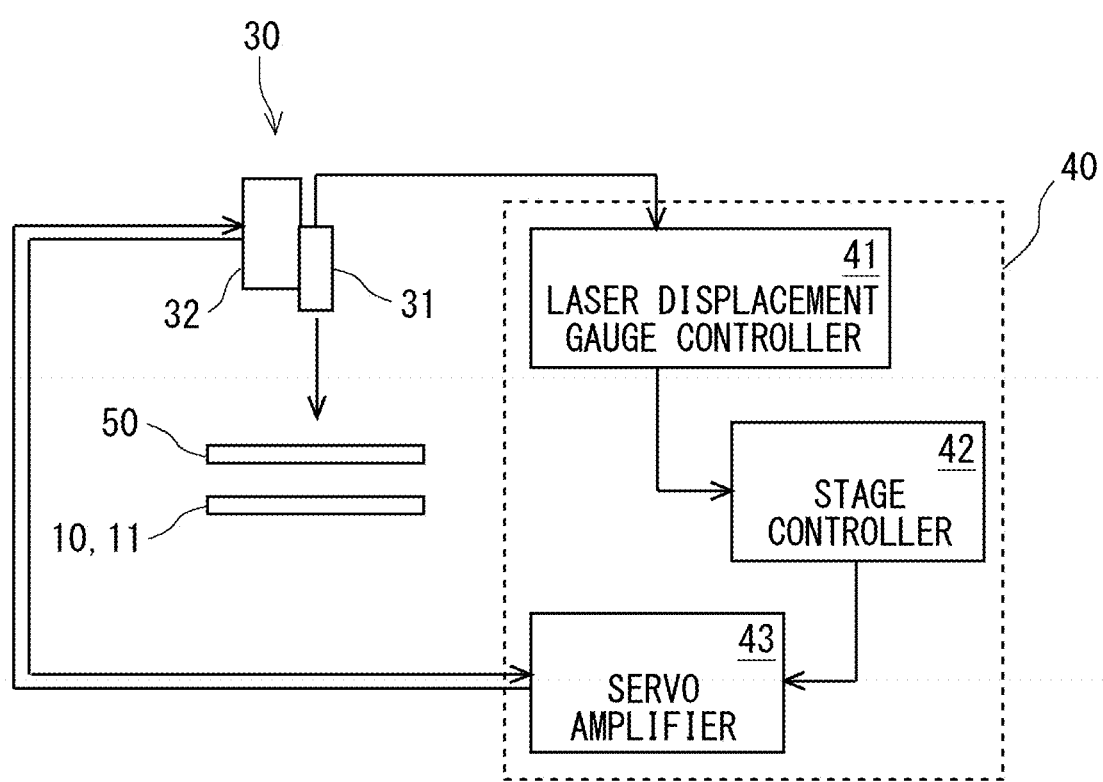
FIG. 6 is a configuration diagram showing an example of a floating-height measurement apparatus and a controller in the substrate-floatation-type laser processing apparatus according to the first embodiment.

Embodiment According to Present Disclosure:
Floating-Height Measurement Apparatus and Controller Control Next, a floating-height measurement apparatus in the substrate-floatation-type laser processing apparatus 1 according to this embodiment will be described. FIG. 6 is a configuration diagram showing a floating-height measurement apparatus and a controller in the substrate-floatation-type laser processing apparatus according to the first embodiment. As shown in FIG. 6, the floating-height measurement apparatus 30 according to this embodiment is connected to a controller 40. The floating-height measurement apparatus 30 includes a laser displacement gauge 31 and a height adjustment stage 32. The controller 40 includes, for example, a laser displacement gauge controller 41, a stage controller 42, and a servo amplifier 43.

The laser displacement gauge controller 41 is connected to the laser displacement gauge 31, for example, by a wired signal line such as an optical fiber or a wireless signal line. The laser displacement gauge controller 41 is connected to the stage controller 42 by a signal line or the like. The stage controller 42 is connected to the servo amplifier 43 by a signal line or the like. The servo amplifier 43 is connected to the height adjustment stage 32 by a signal line or the like.

The laser displacement gauge controller 41 receives height information including the distances L1, L2 and L3, and the floating height H measured (e.g., calculated) from these distances from the laser displacement gauge 31 through the signal line or the like. The laser displacement gauge controller 41 transmits the received height information to the stage controller 42. The height information may be, for example, an analog signal.

The height information including the measured floating height H is input from the floating-height measurement apparatus 30 to the stage controller 42. The stage controller 42 adjusts the distance between the floating-height measurement apparatus 30 and the substrate 50 based on a preset target value and the input floating height H.

Specifically, the stage controller 42 compares the input floating height H with a preset target value G. Then, when the difference $\Delta$ ($\Delta=H-G$) between the input floating height H and the set target value G is negative (i.e., smaller than zero), the stage controller 42 outputs a height command value for the Z-axis to the servo amplifier 43 so that the floating height H becomes larger than the target value G. The height command value may be an analog signal or a pulsed signal. On the other hand, when the difference $\Delta$ ($\Delta=H-G$) between the input floating height H and the set target value G is positive (i.e., larger than zero), the stage controller 42 outputs a height command value for the Z-axis to the servo amplifier 43 so that the floating height H becomes smaller than the target value G. In this way, the distance between the floating-height measurement apparatus 30 and the substrate 50 is automatically adjusted.

The stage controller 42 may include a storage unit in which the input distances L1, L2 and L3, and the measured floating height H are stored. Further, when the difference between the target value and the input floating height H exceeds a predetermined range, the stage controller 42 excludes the input floating height H from data for adjusting the distance. For example, singular points in the stage surface 10a, such as gaps between floatation units 11 and air ejecting holes in the floatation unit 11, are excluded from the data for adjustment.

The servo amplifier 43 receives the height command value for the Z axis of the height adjustment stage 32 from the stage controller 42. Meanwhile, the servo amplifier 43 acquires information about the height at which the laser displacement gauge 31 is located from the height adjustment stage 32. For example, the servo amplifier 43 acquires the value of the height in the Z-axis at which the laser displacement gauge 31 is located from an encoder provided in the height adjustment stage 32. Then, the servo amplifier 43 moves the height adjustment stage 32 until the height information acquired from the height adjustment stage 32 reaches the height command value received from the stage controller 42.

Even when the positions of the plurality of unit surfaces 11a are displaced from one another in the Z-axis direction and the floatation units 11 and the stage 10 do not have a planar relation therebetween over the entire stage surface 10a, the controller 40 adjusts the height of the laser displacement gauge 131 so that the distances L1, L2 and L3 fall within the measurement range R. Therefore, the distances L1, L2 and L3 do not exceed the measurement range R. In this way, the floating height of the substrate 50 can be precisely measured.

As described above, in the substrate-floatation-type laser processing apparatus 1 according to this embodiment, the distance between the floating-height measurement apparatus 30 and the substrate 50 can be automatically adjusted according to the measured floating height H by the feedback control. The floating height H of the substrate 50 is measured, for example, by applying laser light to the substrate 50 and the stage 10. Then, the distance between the floating-height measurement apparatus 30 and the substrate 50 is adjusted by using the feedback mechanism in which the measured floating height of the substrate 50 is used as an input. In this way, it is possible to prevent the measured distances L1, L2 and L3 from exceeding the measurement range R.

<Method for Measuring Floating Height of Substrate>

Figure 7:
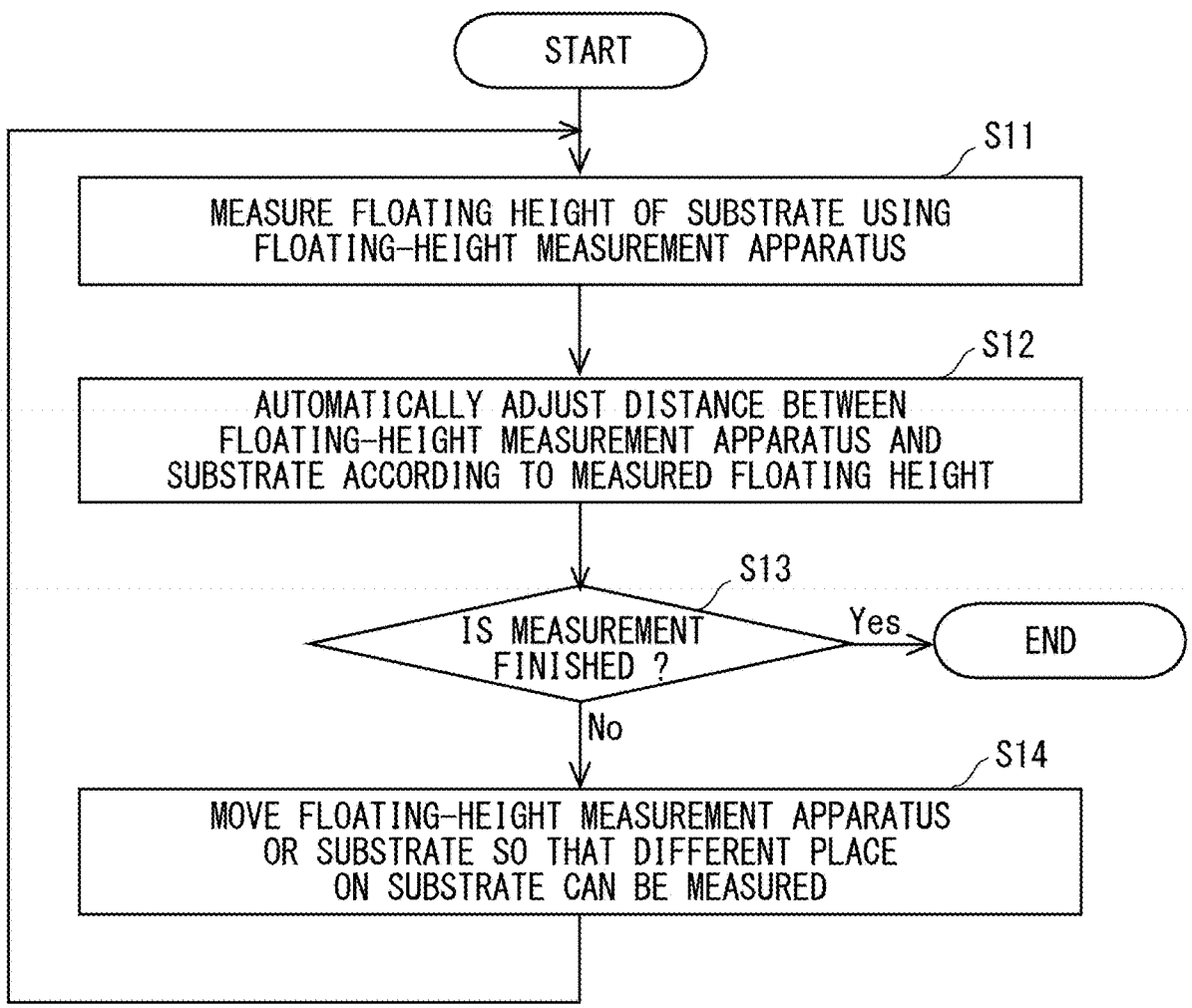
FIG. 7 is a flowchart showing an example of a method for measuring a floating height of a substrate by using the substrate-floatation-type laser processing apparatus according to the first embodiment.

Next, a method for measuring the floating height of the substrate 50 will be described. FIG. 7 is a flowchart showing an example of a method for measuring a floating height of a substrate by using the substrate-floatation-type laser processing apparatus according to the first embodiment.

As shown in a step S11 in FIG. 7, firstly, a floating height H at a predetermined place on the substrate 50 is measured by using the floating-height measurement apparatus 30. The floating-height measurement apparatus 30 includes, for example, a laser displacement gauge 31. The floating height H of the substrate 50 is measured by applying laser light to the substrate 50 and the stage 10. The predetermined place on the substrate 50 may be any place on the substrate 50. For example, the predetermined place may be a place on the substrate 50 located above the floatation unit 11 that is disposed at the end of the substrate 50 on the Y-axis positive side. For example, the laser displacement gauge 31 simultaneously measures (e.g., calculates) the distances L1, L2 and L3 based on differences among the reflectance of reflected light of the laser light reflected by the top surface 50a of the substrate 50, the reflectance of reflected light reflected by the bottom surface 50b of the substrate 50, and the reflectance of reflected light reflected by the stage surface 10a. In this way, the floating-height measurement apparatus 30 measures (i.e., calculates) the floating height H (Floating height H=Distance L3−Distance L2). Note that the floating-height measurement apparatus 30 is not limited to those equipped with the laser displacement gauge 31.

Next, as shown in a step S12, the distance between the floating-height measurement apparatus 30 and the substrate 50 is automatically adjusted according to the measured floating height H. The controller 40, to which the floating height H is input from the floating-height measurement apparatus 30, adjusts the distance between the floating-height measurement apparatus 30 and the substrate 50 based on the preset target value and the input floating height H. In this way, the substrate-floatation-type laser processing apparatus 1 according to this embodiment adjusts the distance between the floating-height measurement apparatus 30 and the substrate 50 by using the feedback mechanism in which the measured floating height of the substrate 50 is used as an input.

Next, as shown in a step S13, it is determined whether or not the measurement of the floating height H of the substrate has been finished. In the case of "Yes", i.e., when the measurement has been finished, the process is finished. In the case of "No", i.e., when the measurement has not been finished, the floating-height measurement apparatus 30 is moved so that a different place on the substrate 50 can be measured as shown in a step S14. For example, the laser displacement gauge 31 is moved by using the translation movement stage 33. In this way, a place on the substrate 50 different from the predetermined place thereon is measured. Alternatively, the substrate 50 may be moved by a grasping unit of the stage 10 so that a different place on the substrate 50 can be measured.

Next, the process returns to the step S11, and the floating height H of the substrate 50 is measured by using the floating-height measurement apparatus 30. Further, the steps S11 to S14 are repeated until the measurement is finished. Therefore, the distance between the floating-height measurement apparatus 30 and the substrate 50 is adjusted for the measurement of the floating height at each measurement place on the substrate 50. Therefore, at each measurement place, the distances L1, L2 and L3 are adjusted so that they get closer to and follow the target values within the measurement range R. In this way, it is possible to precisely measure the floating height of the substrate 50 at each measurement place. In this way, the floating height of the substrate 50 is measured.

<Method for Measuring Floating Height of Stationary Substrate>

Figure 8:
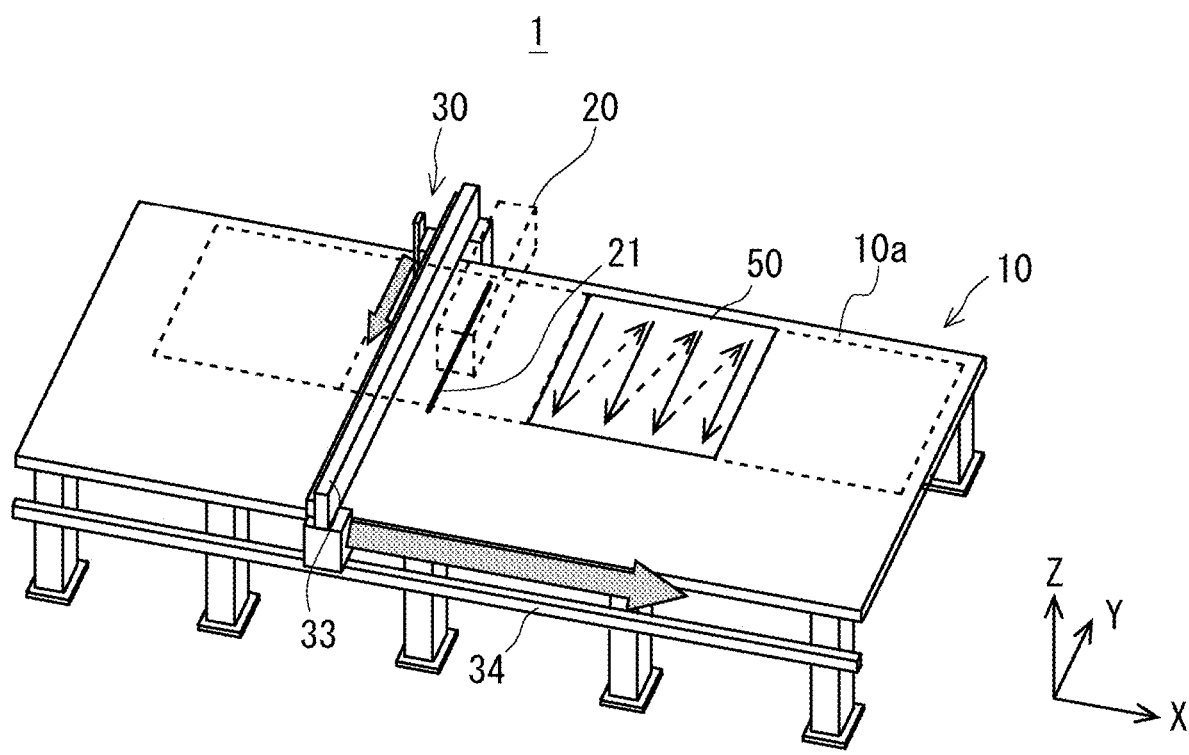
FIG. 8 is a perspective view schematically showing an example of a method for measuring a floating height of a stationary substrate in the substrate-floatation-type laser processing apparatus according to the first embodiment.

As an example of the method for measuring the floating height H of the substrate 50, a method for measuring the floating height H of a stationary substrate 50 will be described. The term "stationary" means a case where the floating height H of the substrate 50 is measured without conveying the substrate 50. FIG. 8 is a perspective view schematically showing an example of a method for measuring a floating height of a stationary substrate in the substrate-floatation-type laser processing apparatus according to the first embodiment.

As shown in FIG. 8, when the floating height H of the substrate 50 is statically measured without conveying the substrate 50, the floating height H of the substrate 50 is measured while moving the floating-height measurement apparatus 30 by using the translation movement stages 33 and 34. Then, the floating height H of the substrate 50 over the entire stage surface 10a is measured by changing the position of the substrate 50 disposed over the stage surface 10a. In this way, it is possible to find a part(s) at which the floating height between the stage 10 and the substrate 50 is smaller than those at other parts and a part(s) at which the stage 10 and the substrate 50 are in contact with each other in advance. Therefore, it is possible to suppress the generation of dust and the like which would otherwise be caused by contact between the substrate 50 and the stage 10.

<Method for Measuring Floating Height of Moving Substrate>

Figure 9:
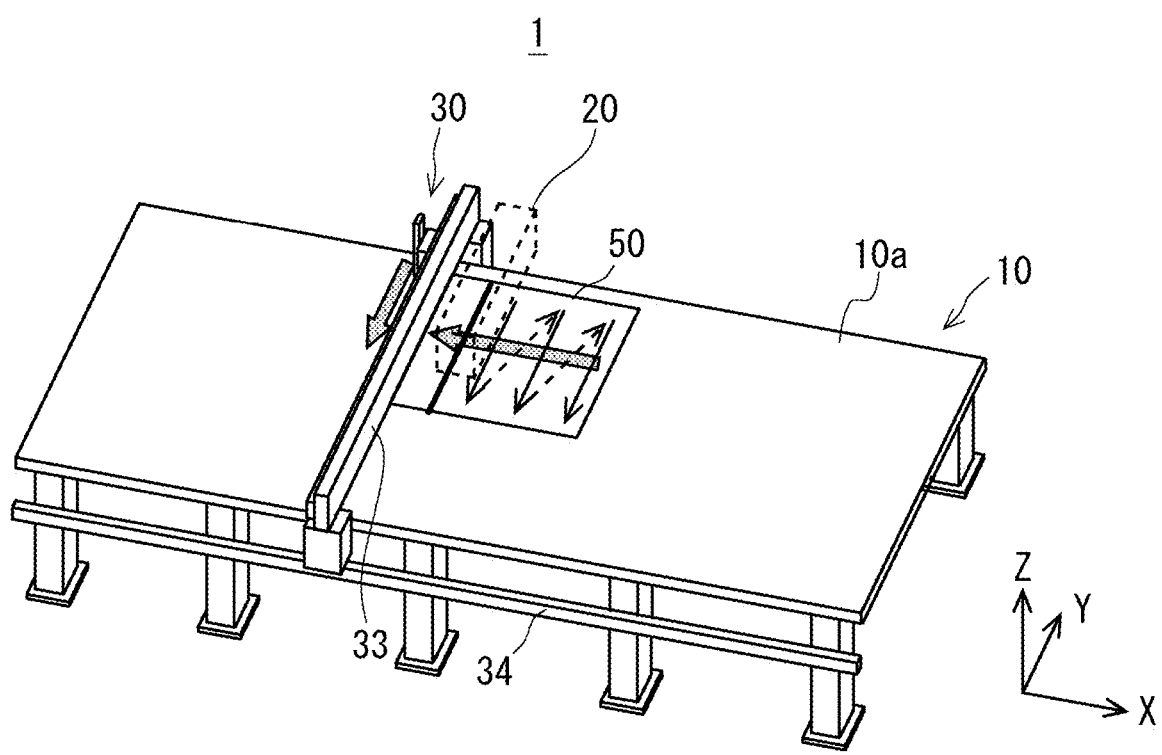
FIG. 9 is a perspective view schematically showing an example of a method for measuring a floating height of a moving substrate in the substrate-floatation-type laser processing apparatus according to the first embodiment.

Next, as an example of the method for measuring the floating height H of the substrate 50, a method for measuring the floating height H of a moving substrate 50 will be described. The term "moving" means a case where the floating height H of the substrate 50 is measured while conveying the substrate 50. FIG. 9 is a perspective view schematically showing an example of a method for measuring a floating height of a moving substrate in the substrate-floatation-type laser processing apparatus according to the first embodiment.

As shown in FIG. 9, when the floating height H of the substrate 50 is dynamically measured while conveying the substrate 50, the floating height H of the substrate 50 is measured while conveying the substrate 50 by using a grasping unit of the stage 10. The method for measuring the floating height H of the moving substrate 50 is important, for example, when the floating height H of a substrate 50 which is disposed over the stage 10 disposed below the laser emission unit 20 is measured. When the substrate 50 is conveyed to a place located below the laser emission unit 20, the substrate 50 may be slanted upward or warped. As a result, the focal point of the laser light is displaced and hence the desired laser light cannot be applied to the substrate 50. Therefore, by measuring the floating height H of the moving substrate 50 located below the laser emission unit 20 in advance, the irradiation place of the laser light can be precisely measured. In this way, it is possible to improve the performance of the laser processing.

Next, effects of this embodiment will be described. In the substrate-floatation-type laser processing apparatus 1 according to this embodiment, the distance between the floating-height measurement apparatus 30 and the substrate 50 can be automatically adjusted. That is, by controlling the height by feeding back the output of the laser displacement gauge 31, the distances L2 and L3 automatically fall within the measurement range R of the laser displacement gauge 31 even when the measurement place of the laser displacement gauge 31 is moved. Therefore, it is possible to prevent the measured distances L1, L2 and L3 from exceeding the measurement range R of the floating-height measurement apparatus 30. For example, the distances L1, L2 and L3 are made to follow the target values within the measurement range R, so that the distance between the floating-height measurement apparatus 30 and the substrate 50 is automatically adjusted. Therefore, since the distances L1, L2 and L3 do not exceed the measurement range, the floating height of the substrate 50 can be precisely measured.

Further, since the floating height H of the substrate 50 is measured over the entire stage surface 10a, it is possible to find a part(s) at which the floating height between the stage 10 and the substrate 50 is smaller than those at other parts and a part(s) at which the stage 10 and the substrate 50 are in contact with each other in advance. In this way, it is possible to suppress the generation of dust and the like which would otherwise be caused by contact between the substrate 50 and the stage 10.

Further, by measuring the floating height H of the moving substrate 50 located below the laser emission unit 20, the irradiation place of the laser light can be precisely measured. In this way, it is possible to improve the performance of the laser processing.

The floating height H of the substrate 50 is measured by applying laser light to the substrate 50 and the stage 10. Therefore, it is possible to carry out accurate measurement using the wavelength of the laser light.

Note that although the case in which the distance between the floating-height measurement apparatus 30 and the substrate 50 is adjusted by using the feedback mechanism is described above, a user may manually adjust the height adjustment stage 32 so that the distances L1 to L3 fall within the measurement range R. Further, it does not exclude cases where the height on the floatation unit 11 side is adjusted so that the distances L1 to L3 fall within the measurement range R.

Further, the distance between the floating-height measurement apparatus 30 and the stage surface 10a may be measured and stored in the storage unit in advance. That is, the controller 40 includes a storage unit in which the distance between the floating-height measurement apparatus 30 and the stage surface 10a is stored in advance. Then, in order to make the height of the laser displacement gauge 31 constant no matter where the laser displacement gauge 31 is moved on the XY-plane, the controller 40 automatically adjusts the distance between the floating-height measurement apparatus 30 and the substrate 50 by using the distance between the floating-height measurement apparatus 30 and the stage surface 10a stored in the storage unit so that the distances L1 to L3 fall within the measurement range R. Therefore, since the distances L1 to L3 do not exceed the measurement range R, the floating height of the substrate 50 can be precisely measured.

Second Embodiment

Figure 10:
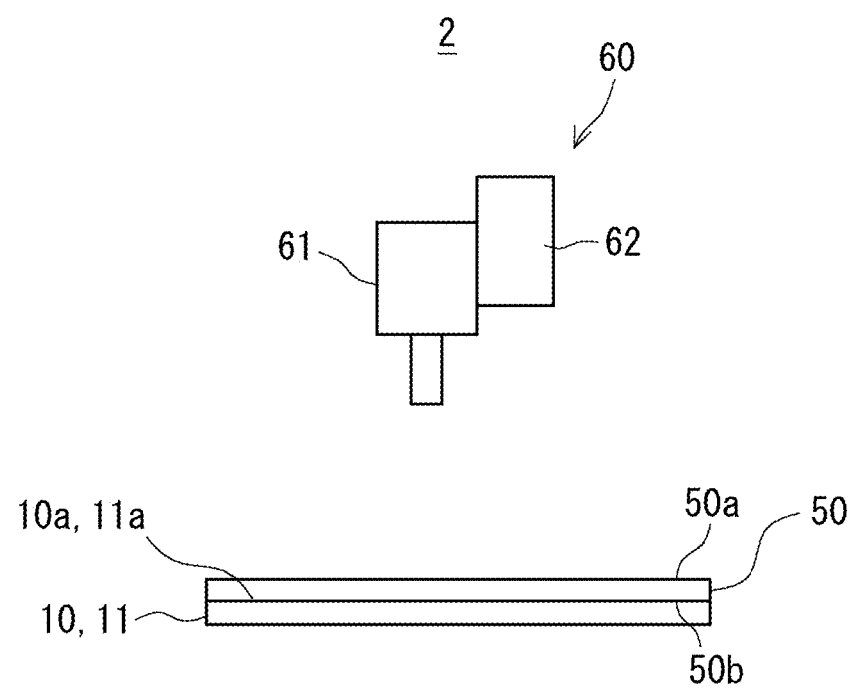
FIG. 10 schematically shows an example of operations that the floating-height measurement apparatus performs to measure a floating height of a substrate in a substrate-floatation-type laser processing apparatus according to a second embodiment.
Figure 11:
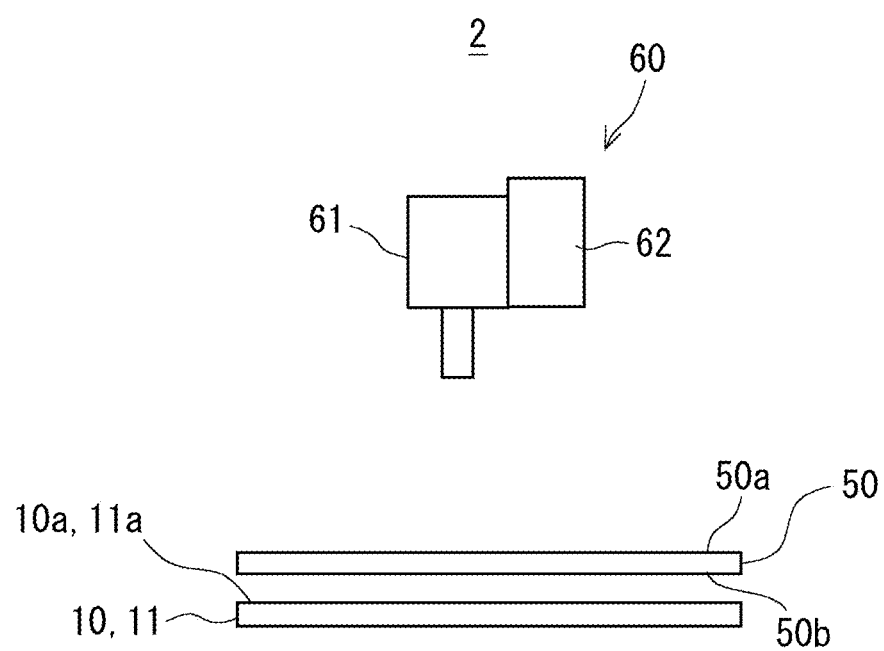
FIG. 11 schematically shows an example of operations that the floating-height measurement apparatus performs to measure a floating height of a substrate in the substrate-floatation-type laser processing apparatus according to the second embodiment.

Next, a substrate-floatation-type laser processing apparatus according to a second embodiment will be described. In this embodiment, the floating-height measurement apparatus includes a camera. FIGS. 10 and 11 schematically show an example of operations that the floating-height measurement apparatus performs to measure a floating height of a substrate in the substrate-floatation-type laser processing apparatus according to the second embodiment.

As shown in FIGS. 10 and 11, the floating-height measurement apparatus 60 of the substrate-floatation-type laser processing apparatus 2 according to this embodiment includes a camera 61 and a height adjustment stage 62. The camera 61 takes an image of the top surface 50a of the substrate 50. The height adjustment stage 62 is attached to the camera 61. The height adjustment stage 62 can adjust the position of the focal point of the camera 61 in the Z-axis direction, i.e., the height of the focal point of the camera 61. A measurement range in which the camera 61 can adjust its focus is set in the camera 61. When the position of the focal point exceeds the measurement range, the floating height H of the substrate 50 cannot be precisely measured. Therefore, the height adjustment stage 32 adjusts the height of the camera 61 so that its focal point falls within the measurement range.

When the floating height H of the substrate 50 is measured by using the camera 61, the floating height H is measured by adjusting the position of the focal point of the camera 61 onto the top surface 50a of the substrate 50 before and after the substrate 50 is floated. That is, as shown in FIG. 10, the substrate 50 is brought down to the floatation unit 11 by stopping the ejection of air in the floatation units 11 (step A). Then, the height of the camera 61 at which its focal point coincides with the top surface 50a of the substrate 50 is found by adjusting the height of the camera 61 by using the height adjustment stage 62 (step B).

Next, as shown in FIG. 11, the substrate 50 is floated by ejecting air in the floatation units 11 (step C). Then, the height of the camera 61 at which its focal point coincides with the top surface 50a of the substrate 50 is found again by adjusting the height of the camera 61 by using the height adjustment stage 62 (step D). Next, a difference between the height found in the step B and the height found in the step D is measured (e.g., calculated) as the floating height H.

As described above, in this embodiment, the camera 61 can measure the floating height H of the substrate 50 based on the position of the camera 61 at which its focal point coincides with the top surface 50a of the substrate 50 when the substrate 50 is brought into contact with the stage 10 and the position of the camera 61 at which its focal point coincides with the top surface 50a of the substrate 50 when the substrate 50 is floated over the stage 10.

Note that when the camera 61 can take an image of the bottom surface 50b of the substrate 50 and the stage surface 10a through the substrate 50 (e.g., in a fluoroscopic manner), the camera 61 may measure the floating height H of the substrate 50 based on the position of the camera 61 at which its focal point coincides with the top surface 50a or the bottom surface 50b of the substrate 50 and the position of the camera 61 at which its focal point coincides with the stage surface 10a. Specifically, a difference between the height of the camera 61 at which its focal point coincides with the top surface 50a or the bottom surface 50b of the substrate 50 and the height of the camera 61 at which its focal point coincides with the stage surface 10a may be measured (e.g., calculated) as the floating height H. Note that when the focal point is adjusted onto the top surface 50a of the substrate 50, the floating height is obtained by subtracting the thickness of the substrate 50 from the difference between the heights.

According to the substrate-floatation-type laser processing apparatus 2 in accordance with this embodiment, the floating-height measurement apparatus 60 uses the camera 61. Further, since the floating height H of the substrate 50 can be measured based on the position of the focal point of the camera 61, the floating height H can be easily measured. The rest of the configuration and effects are described above in the description of the first embodiment.

Third Embodiment

Figure 12:
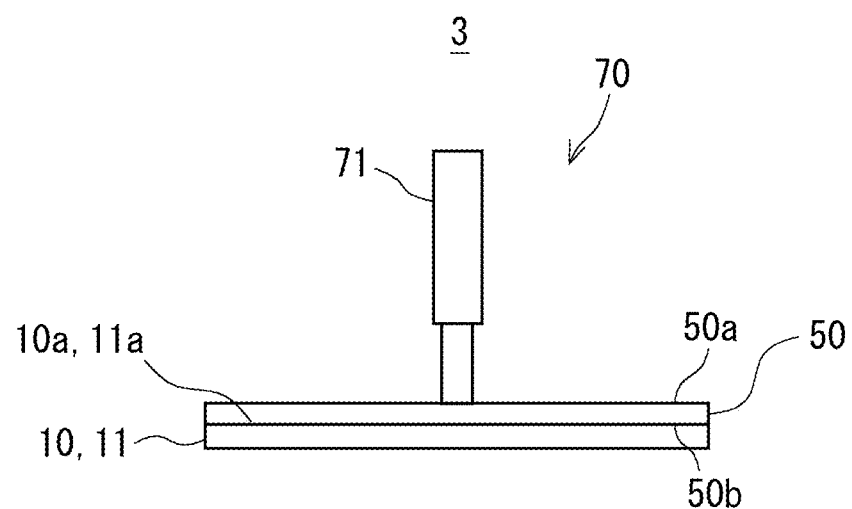
FIG. 12 schematically shows an example of operations that the floating-height measurement apparatus performs to measure a floating height of a substrate in a substrate-floatation-type laser processing apparatus according to a third embodiment.
Figure 13:
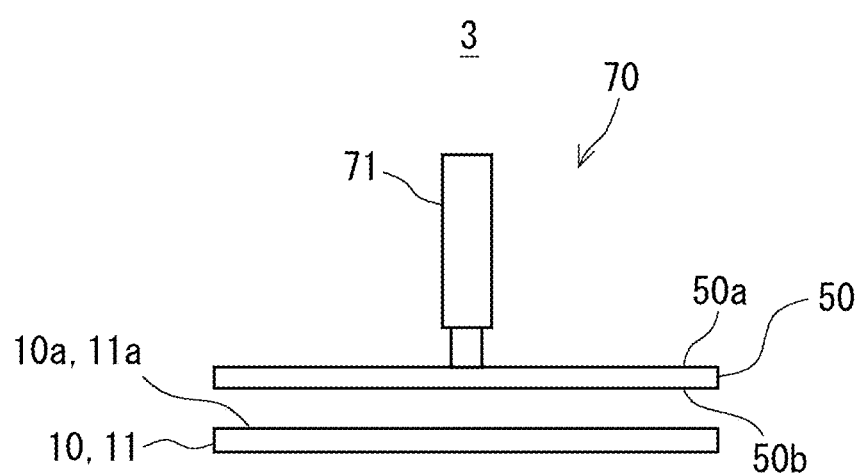
FIG. 13 schematically shows an example of operations that the floating-height measurement apparatus performs to measure a floating height of a substrate in the substrate-floatation-type laser processing apparatus according to the third embodiment.

Next, a substrate-floatation-type laser processing apparatus according to a third embodiment will be described. In this embodiment, the floating-height measurement apparatus includes a length measurement device. FIGS. 12 and 13 schematically show an example of operations that the floating-height measurement apparatus performs to measure a floating height of a substrate in the substrate-floatation-type laser processing apparatus according to the third embodiment.

As shown in FIGS. 12 and 13, the floating-height measurement apparatus 70 of the substrate-floatation-type laser processing apparatus 3 according to this embodiment includes a length measurement device 71. The length measurement device 71 measures a distance to the top surface 50a of the substrate 50. The length measurement device 71 is, for example, a contact-type length measurement device, an ultrasonic displacement sensor, or a linear proximity sensor. The contact-type length measurement device is, for example, a pick tester, a digital gauge, or the like, and is brought into contact with the top surface 50a of the substrate 50 to measure the distance to the top surface 50a of the substrate 50. The ultrasonic displacement sensor applies ultrasonic waves to the substrate 50 and measures (e.g., calculates) the distance to the top surface 50a of the substrate 50 from reflected waves of the ultrasonic waves reflected by the top surface 50a of the substrate 50. The linear proximity sensor measures the distance to the top surface 50a of the substrate 50 by using a metal plate disposed over the top surface 50a of the substrate 50.

When the floating height H of the substrate 50 is measured by using the length measurement device 71, the following steps are performed. That is, as shown in FIG. 12, the substrate 50 is brought down to the floatation unit 11 by stopping the ejection of air in the floatation units 11 (step A). Then, the length measurement device 71 is disposed over the top surface 50a of the substrate 50 (step B).

Next, as shown in FIG. 13, the substrate 50 is floated by ejecting air in the floatation units 11 (step C). Then, the length of the displacement of the length measurement device 71 when the substrate 50 is floated is measured (step D). The floating height H can be measured based on the length of the displacement of the length measurement device 71.

As described above, in this embodiment, the length measurement device 71 can measure the floating height H of the substrate 50 based on the distance to the top surface 50a of the substrate 50 when the substrate 50 is brought into contact with the stage 10 and the distance to the top surface 50a of the substrate 50 when the substrate 50 is floated over the stage 10.

According to the substrate-floatation-type laser processing apparatus 3 in accordance with this embodiment, the floating-height measurement apparatus 70 uses the length measurement device 71. By using the length measurement device 71, the distance to the top surface 50a of the substrate 50 can be precisely measured. The rest of the configuration and effects are described above in the descriptions of the first and second embodiments.

The present disclosure made by the inventors of the present application has been explained above in a concrete manner based on embodiments. However, the present disclosure is not limited to the above-described embodiments, and needless to say, various modifications can be made without departing from the spirit and scope of the present disclosure.

The first to the third embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A substrate-floatation-type laser processing apparatus comprising:
    a floating stage configured to float and convey a substrate;
    a floating-height measurement apparatus configured to measure a floating height of the substrate in the floating stage, the floating height being a distance between a top surface of the floating stage and a bottom surface of the substrate in the floating stage; and
    a controller to which the measured floating height is input from the floating-height measurement apparatus, the controller being configured to determine a difference between the measured floating height and a preset target value, wherein
    a distance along a vertical axis between the floating-height measurement apparatus and the substrate in the floating stage is automatically adjusted based on the determined difference by moving the floating-height measurement apparatus along the vertical axis,
    wherein the distance between the floating-height measurement apparatus and the substrate is adjusted so as to make the floating height larger than the preset target value when the difference is negative, and so as to make the floating height smaller than the preset target value when the difference is positive.

2. The substrate-floatation-type laser processing apparatus according to claim 1, wherein the floating height of the substrate is measured by applying laser light to the substrate and the floating stage.

3. The substrate-floatation-type laser processing apparatus according to claim 1, wherein the distance between the floating-height measurement apparatus and the substrate is adjusted by using a feedback mechanism in which the measured floating height of the substrate is used as an input.

4. The substrate-floatation-type laser processing apparatus according to claim 2, wherein
    the floating-height measurement apparatus comprises a laser displacement gauge configured to apply the laser light to the substrate and the floating stage and receive reflected light of the laser light reflected by the substrate and the floating stage, and
    the laser displacement gauge measures the floating height of the substrate from reflected light of the laser light reflected by a bottom surface of the substrate and reflected light of the laser light reflected by a top surface of the floating stage.

5. The substrate-floatation-type laser processing apparatus according to claim 1, wherein
    the floating-height measurement apparatus comprises a camera configured to take an image of a top surface of the substrate, and
    the camera measures the floating height of the substrate based on its position at which its focal point coincides with the top surface of the substrate when the substrate is brought into contact with the floating stage and its position at which its focal point coincides with the top surface of the substrate when the substrate is floated over the floating stage.

6. The substrate-floatation-type laser processing apparatus according to claim 1, wherein
    the floating-height measurement apparatus comprises a camera configured to take an image of a top surface of the substrate, and
    the camera measures the floating height of the substrate based on its position at which its focal point coincides with the top surface or a bottom surface of the substrate and its position at which its focal point coincides with the top surface of the floating stage.

7. The substrate-floatation-type laser processing apparatus according to claim 1, wherein
    the floating-height measurement apparatus comprises a length measurement device configured to measure a distance to a top surface of the substrate, and
    the length measurement device measures the floating height of the substrate based on a distance to the top surface of the substrate when the substrate is brought into contact with the floating stage and a distance to the top surface of the substrate when the substrate is floated over the floating stage.

8. The substrate-floatation-type laser processing apparatus according to claim 1, wherein the floating-height measurement apparatus comprises a translation movement stage extending in one direction on a horizontal plane above the floating stage, and the floating-height measurement apparatus measures the floating height of the substrate along the one direction.

9. The substrate-floatation-type laser processing apparatus according to claim 8, wherein the translation movement stage is movable in another direction perpendicular to the one direction on the horizontal plane above the floating stage.

10. The substrate-floatation-type laser processing apparatus according to claim 1, wherein the floating stage comprises a plurality of floatation units configured to eject air for floating the substrate, and a top surface of the floating stage includes top surfaces of the plurality of floatation units.

11. The substrate-floatation-type laser processing apparatus according to claim 1, wherein the controller excludes the input floating height from data for adjusting the distance when the difference between the target value and the input floating height exceeds a predetermined range.

12. The substrate-floatation-type laser processing apparatus according to claim 1, wherein the controller comprises a storage unit in which a distance between the floating-height measurement apparatus and the floating stage is stored, and the controller corrects the measured floating height of the substrate by using the distance stored in the storage unit.

\* \* \* \* \*